(12) United States Patent  
Deokar et al.

(10) Patent No.: US 9,638,726 B2  
(45) Date of Patent: May 2, 2017

(54) SYSTEM AND METHOD FOR DETECTING BRANCH CIRCUIT CURRENT

(75) Inventors: Vishwas Mohaniraj Deokar, Acton, MA (US); Brian Patrick Mearns, Somerville, MA (US); Bret Alan Orner, Wellesley, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 83 days.

(21) Appl. No.: 14/391,332

(22) PCT Filed: Apr. 12, 2012

(86) PCT No.: PCT/US2012/033258  
§ 371 (c)(1),  
(2), (4) Date: Oct. 8, 2014

(87) PCT Pub. No.: WO2013/154563  
PCT Pub. Date: Oct. 17, 2013

(65) Prior Publication Data  
US 2015/0102800 A1    Apr. 16, 2015

(51) Int. Cl.  
*G01R 13/00* (2006.01)  
*H02H 3/00* (2006.01)  
(Continued)

(52) U.S. Cl.  
CPC ....... *G01R 19/0092* (2013.01); *G01R 31/026* (2013.01); *G01R 31/2829* (2013.01)

(58) Field of Classification Search  
CPC . G01R 19/002; G01R 31/2829; G01R 31/026  
(Continued)

(56) References Cited

U.S. PATENT DOCUMENTS

| 4,158,808 A | 6/1979 | Massa et al. |
| 4,258,348 A | 3/1981 | Belfer et al. |

(Continued)

FOREIGN PATENT DOCUMENTS

| CN | 1495432 A | 5/2004 |
| CN | 1717844 A | 1/2006 |

(Continued)

OTHER PUBLICATIONS

Power Systems Design, Smart Grid Integrity, 2010, http://www.powersystemsdesign.com/smart-grid-integrity.

(Continued)

*Primary Examiner* — Farhana Hoque  
(74) *Attorney, Agent, or Firm* — Lando & Anastasi, LLP (57) ABSTRACT

According to one aspect, embodiments of the invention provide a system monitor for a load center comprising a current sensor configured to be coupled to a circuit branch within the load center and to produce a measurement signal having a level related to a current level of the circuit branch, a sensor circuit coupled to the current sensor and removably coupled to a terminal, the sensor circuit configured to provide the measurement signal to the terminal, and a controller coupled to the terminal and configured to monitor signals at the terminal, wherein the controller is further configured to detect disconnection of the current sensor from the terminal based on a signal level at the terminal.

13 Claims, 6 Drawing Sheets

(51) Int. Cl.
*G01R 19/00* (2006.01)
*G01R 31/02* (2006.01)
*G01R 31/28* (2006.01)

(58) Field of Classification Search
USPC .............................. 324/140 R, 76.11; 361/42
See application file for complete search history.

(56) References Cited

U.S. PATENT DOCUMENTS

| | | |
|---|---|---|
| 5,179,376 A | 1/1993 | Pomatto |
| 5,416,808 A | 5/1995 | Witsaman et al. |
| 5,800,187 A | 9/1998 | Vermon et al. |
| 5,831,428 A | 11/1998 | Pyle et al. |
| 5,855,491 A | 1/1999 | Hintner et al. |
| 5,896,027 A | 4/1999 | So et al. |
| 5,959,818 A | 9/1999 | Blakely |
| 5,995,911 A | 11/1999 | Hart |
| 6,064,192 A | 5/2000 | Redmyer |
| 6,091,237 A | 7/2000 | Chen |
| 6,243,626 B1 | 6/2001 | Schanin |
| 6,291,986 B1 | 9/2001 | Sorensen |
| 6,292,108 B1 | 9/2001 | Straser et al. |
| 6,292,717 B1 | 9/2001 | Alexander et al. |
| 6,313,641 B1 | 11/2001 | Brooks |
| 6,330,516 B1 | 12/2001 | Kammeter |
| 6,373,238 B2 | 4/2002 | Lewis et al. |
| 6,452,767 B1 | 9/2002 | Brooks |
| 6,634,240 B1 | 10/2003 | Wallen |
| 6,788,508 B2 | 9/2004 | Papallo, Jr. et al. |
| 6,792,337 B2 | 9/2004 | Blackett et al. |
| 6,865,073 B2 | 3/2005 | Werner et al. |
| 7,253,640 B2 | 8/2007 | Engel et al. |
| 7,265,533 B2 | 9/2007 | Lightbody et al. |
| 7,412,338 B2 | 8/2008 | Wynans et al. |
| 7,453,267 B2 | 11/2008 | Westbrock, Jr. et al. |
| 8,004,226 B2 | 8/2011 | Hartman et al. |
| 8,321,163 B2 | 11/2012 | Ewing et al. |
| 8,700,747 B2 | 4/2014 | Spitaels et al. |
| 8,787,372 B2 | 7/2014 | Cohen et al. |
| 8,958,923 B2 | 2/2015 | Kake et al. |
| 9,267,826 B2 | 2/2016 | Paik et al. |
| 2003/0222603 A1 | 12/2003 | Mogilner et al. |
| 2004/0075343 A1 | 4/2004 | Wareham et al. |
| 2004/0128087 A1 | 7/2004 | Viaro et al. |
| 2004/0136124 A1 | 7/2004 | Engel et al. |
| 2004/0183522 A1 | 9/2004 | Gunn et al. |
| 2005/0210337 A1 | 9/2005 | Chester et al. |
| 2006/0238932 A1 | 10/2006 | Westbrock et al. |
| 2007/0136010 A1 | 6/2007 | Gunn et al. |
| 2008/0007416 A1 | 1/2008 | Cern |
| 2008/0094162 A1 | 4/2008 | Schaerrer et al. |
| 2008/0126665 A1 | 5/2008 | Burr et al. |
| 2008/0180275 A1 | 7/2008 | Whitaker et al. |
| 2008/0238573 A1 | 10/2008 | Yamazaki |
| 2009/0066317 A1 | 3/2009 | de Buda |
| 2009/0115403 A1 | 5/2009 | Bernklau |
| 2009/0292403 A1 | 11/2009 | Howell et al. |
| 2010/0033122 A1 | 2/2010 | Hartman et al. |
| 2010/0060469 A1 | 3/2010 | Hetzmannseder et al. |
| 2010/0085036 A1 | 4/2010 | Banting et al. |
| 2010/0235122 A1* | 9/2010 | McCrea ................. G01R 21/06 702/64 |
| 2010/0237853 A1 | 9/2010 | Bose et al. |
| 2010/0264906 A1 | 10/2010 | Shamir et al. |
| 2010/0299401 A1 | 11/2010 | Lloyd |
| 2010/0308792 A1 | 12/2010 | Rupert et al. |
| 2010/0328849 A1 | 12/2010 | Ewing et al. |
| 2011/0046792 A1 | 2/2011 | Imes et al. |
| 2011/0148393 A1 | 6/2011 | de Buda |
| 2012/0062249 A1 | 3/2012 | Shamir |
| 2012/0085627 A1 | 4/2012 | Yang |
| 2012/0191878 A1 | 7/2012 | Yoshida |
| 2012/0200285 A1 | 8/2012 | Carpenter et al. |
| 2012/0203481 A1* | 8/2012 | Carpenter ............ G01R 21/133 702/62 |
| 2012/0271570 A1 | 10/2012 | Paik et al. |
| 2012/0271579 A1 | 10/2012 | Deokar et al. |
| 2013/0018609 A1 | 1/2013 | Filippenko et al. |
| 2013/0090869 A1 | 4/2013 | Ewing et al. |
| 2013/0165107 A1 | 6/2013 | Richardson |

FOREIGN PATENT DOCUMENTS

| | | |
|---|---|---|
| CN | 201035075 Y | 3/2008 |
| CN | 101277130 A | 10/2008 |
| CN | 201667273 U | 12/2010 |
| CN | 102122810 A | 7/2011 |
| CN | 102299559 A | 12/2011 |
| CN | 102393485 A | 3/2012 |
| DE | 29512624 U1 | 11/1995 |
| DE | 10201495 A1 | 8/2003 |
| EP | 1102073 A1 | 5/2001 |
| EP | 1 703 289 A1 | 9/2006 |
| EP | 1983616 A2 | 10/2008 |
| EP | 2 354 799 A1 | 8/2011 |
| GB | 2 241 396 A | 8/1991 |
| WO | 2005029671 A1 | 3/2005 |
| WO | 2006021030 A1 | 3/2006 |
| WO | 2011/150173 A1 | 12/2011 |

OTHER PUBLICATIONS

"Emonitor Installation Guide", 2010 PowerHouse Dynamics, Inc., pp. 1-39.
"Emonitor User Manual", 2010 PowerHouse Dynamics, Inc., pp. 1-50.
"Panelboard Monitoring System", www.veris.com, 2008 Veris Industries, pp. 136-137.
"TED 5000 Footprints User Manual", www.theenergydetective.com, pp. 1-37.
Chung-Ping Young et al., "Digital Power Metering Manifold", IEEE Transactions on Instumentation and Measurement, IEEE Service Center, Piscataway, NJ, US, vol. 47, No. 1, Feb. 1, 1998 (Feb. 1, 1998), XP011024460, pp. 224-228.
International Search Report for corresponding PCT/US2012/033258 dated Jul. 27, 2012.
Mars, Using a supercapacitor to manage your power, Energy Harvesting Journal, Dec. 14, 2009, pp. 1-11.
"Oscillator Options", Meinberg, https://meinbergglobal.com, Nov. 2015.
"PowerLogic ION7300 Series, Power & Energy Meter, Modicon Modbus Serial Communications Protocol", Schneider Electric, Dec. 2006.
"Protime 100 Sequence of Event Recorder User's Guide", Monaghan Engineering, Inc., Publication #10032, Version 1.10, Sep. 10, 2013.
"SICAM I/O Unit 7XV5673 Device Manual", Siemens, E50417-H1040-C484-A4, Nov. 2014.
"Time stamping and synchronisation", Current Trends, EBG—Electrical Systems & Equipment, Larsen & Toubro Limited, Powai Works, Mumbai 400 072, Jan.-Mar. 2004.
"Time Synchronization & Timekeeping", Schneider Electric, 70072-0111-14, Jun. 2009.
"Time Synchronization in Electrical Systems", Meinberg,[<https://www.meinbergglobal.com/english/info/time-synchronization-electrical-systems.htm>], Retrieved from the Internet on Jul. 1, 2016.
"Time Synchronization Using ABB Relays", ABB Application Note, Substation Automation and Protection Dvision, AN-96A-04, DPU2000R, Jul. 7, 2004.
Australian Patent Examination Report from corresponding Australian Patent Application No. 2012376819 issued May 18, 2016.
Cristian et al., "Probabilistic clock synchronization", Distributed Computing (1989) 3: pp. 146-158.
Extended European Search Report from corresponding European Application No. 12875243.3 dated Nov. 10, 2015.

* cited by examiner

SYSTEM AND METHOD FOR DETECTING BRANCH CIRCUIT CURRENT

This application is a U.S. National Stage Application and claims priority under 35 U.S.C. §371 from International Application No. PCT/US2012/033258, filed Apr. 12, 2012, which is hereby incorporated herein by reference in its entirety.

BACKGROUND OF INVENTION

Field of the Invention

At least one example in accordance with the present invention relates generally to systems and methods for detecting branch circuit current, and at least one example is directed to detecting the presence of a current sensor within a load center.

Discussion of Related Art

A load center or panelboard is a component of an electrical supply system which divides an electrical power feed from a power line into different subsidiary circuit branches. Each subsidiary circuit branch may be connected to a different load. Thus, by dividing the electrical power feed into subsidiary circuit branches, the load center may allow a user to individually control and monitor the current, power and energy usage of each load.

Current sensors are commonly used to monitor activity of a load center. For example, Current Transformers (CT) are commonly used to monitor current, power and/or energy consumption in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC measurement signal, proportionate to the magnitude of AC current in the branch. The reduced current AC measurement signal may then either be measured directly or converted to a digital signal and then extrapolated. Based on the signal received, the level of current in the subsidiary branch may be determined.

SUMMARY OF THE INVENTION

Aspects in accord with the present invention are directed to a system monitor for a load center comprising a current sensor configured to be coupled to a circuit branch within the load center and to produce a measurement signal having a level related to a current level of the circuit branch, a sensor circuit coupled to the current sensor and removably coupled to a terminal, the sensor circuit configured to provide the measurement signal to the terminal, and a controller coupled to the terminal and configured to monitor signals at the terminal, wherein the controller is further configured to detect disconnection of the current sensor from the terminal based on a signal level at the terminal.

According to one embodiment, the controller is further configured to determine whether the signal level at the terminal falls within a predetermined envelope. In one embodiment, the controller is further configured to detect disconnection of the current sensor from the terminal based on the signal level at the terminal falling outside of the predetermined envelope for a predetermined period of time. In another embodiment, the controller is further configured to detect connection of the current sensor to the terminal based on the measurement signal at the terminal falling within the predetermined envelope.

According to another embodiment, the controller includes a timer having a value equal to the period of time, and wherein the controller is further configured to start the timer in response to detection of the signal level at the terminal falling outside of the predetermined envelope. In one embodiment, the controller is further configured to reset the timer in response to the signal level at the terminal falling within the predetermined envelope after previously falling outside of the predetermined envelope. In one embodiment, the controller is further configured to determine that the current sensor is disconnected from the terminal in response to expiration of the timer.

According to one embodiment, the current sensor includes a current transformer. In another embodiment, the controller is further configured to monitor signals at the terminal at 15 second intervals.

According to another embodiment, the predetermined envelope is defined about a zero-crossing value.

Another aspect in accord with the present invention is directed to a method for monitoring current in a load center using a current sensor coupled to a circuit branch within the load center, the method comprising monitoring signals at a terminal, comparing a signal level at the terminal with a predetermined envelope, determining that the signal level at the terminal falls outside of the predetermined envelope, starting a timer in response to determining that the signal level at the terminal falls outside of the predetermined envelope, and identifying that the current sensor is disconnected from the terminal in response to expiration of the timer.

According to one embodiment, the method further comprises resetting the timer in response to determining that the signal level at the terminal falls within the predetermined envelope after previously falling outside of the predetermined envelope.

According to another embodiment, the method further comprises identifying that the current sensor is connected to the terminal in response to the signal level at the terminal falling within the predetermined envelope. In one embodiment, the method further comprises discontinuing monitoring signals at the terminal in response to identifying that the current sensor is disconnected from the terminal. In another embodiment, comparing the signal level at the terminal with a predetermined envelope is performed at 15 second intervals.

According to one embodiment, the current sensor includes a current transformer. In another embodiment, the method further comprises defining the predetermined envelope around a zero-crossing.

One aspect in accord with the present invention is directed to a system for measuring current in a load center comprising a current sensor configured to be coupled to a circuit branch within the load center and to produce a measurement signal having a level related to a current level of the circuit branch, a sensor circuit coupled to the current sensor and removably coupled to a terminal, the sensor circuit configured to provide the measurement signal to the terminal in response to the sensor circuit being coupled to the terminal, and means for identifying that the current sensor is disconnected from the terminal based on a level of a signal detected at the terminal.

According to one embodiment, the current sensor includes a current transformer. In another embodiment, the means for identifying is located external the load center.

BRIEF DESCRIPTION OF DRAWINGS

The accompanying drawings are not intended to be drawn to scale. In the drawings, each identical or nearly identical component that is illustrated in various FIGS. is represented by a like numeral. For purposes of clarity, not every component may be labeled in every drawing. In the drawings.

DETAILED DESCRIPTION

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, CT's may be utilized with a load center of an electrical supply system to monitor circuit branches and assist in providing efficient energy management. For instance, CT's may be coupled to circuit branches inside or outside of a load center and provide measurement signals (in proportion to the current in the circuit branches) to terminals of a main controller and its measuring unit.

Problems may arise in accurately monitoring a circuit branch when a CT coupled to the circuit branch becomes disconnected from the main controller and the controller is unaware that the CT has been disconnected. By monitoring a terminal which is disconnected from a CT, as if the terminal was connected to a CT, the controller wastes energy in monitoring the terminal. Where the controller is battery powered, this could be a relatively large problem.

In addition, the controller may also receive false measurement signals at the terminal in relation to the circuit branch. For example, once the terminal is disconnected from a CT, the controller may still receive false measurement signals that the controller incorrectly associates with the circuit branch. These signals may be abnormally low or high and, absent identification by the controller that the CT is disconnected from the terminal, these abnormally low or high signals may incorrectly identify, to the controller, the level of power being provided by the circuit branch to a load.

Conventional controllers may utilize a separate CT detection subsystem to identify when a CT is coupled to a controller. Such detection subsystems typically utilize a voltage divider to identify when a CT is coupled to a controller. For example, a first resistor of the voltage divider may be located in the CT and a second resistor of the voltage divider may be located within the controller. When the CT and controller are coupled together, the voltage divider, comprised of the pair of resistors, provides a voltage to the controller which identifies that the CT is connected to the controller. Absent the appropriate voltage being provided by the voltage divider, the controller identifies that the CT is not connected to the controller.

However, such CT detection subsystems have multiple drawbacks. Current through the voltage divider of the CT detection subsystem wastes valuable power. In addition, to preserve power, the CT detection subsystem may only be turned on at predefined intervals (e.g., every fifteen minutes) rather than updated continuously. Such intervals may not allow a controller to quickly identify a disconnected or newly connected CT. By only checking a CT detection subsystem at predefined, relatively long, intervals, it is likely that the controller will still waste too much energy and/or receive skewed measurements prior to the disconnected, or new, CT being identified.

Therefore, at least some embodiments herein provide a system and method for quickly detecting current sensor connectivity based on a pattern recognition of signals at a terminal which normally receives output signals from a current sensor. Utilizing pattern recognition on the signals at the terminal itself allows the controller to save power, while still detecting sensor status in a timely manner.

Figure 1:
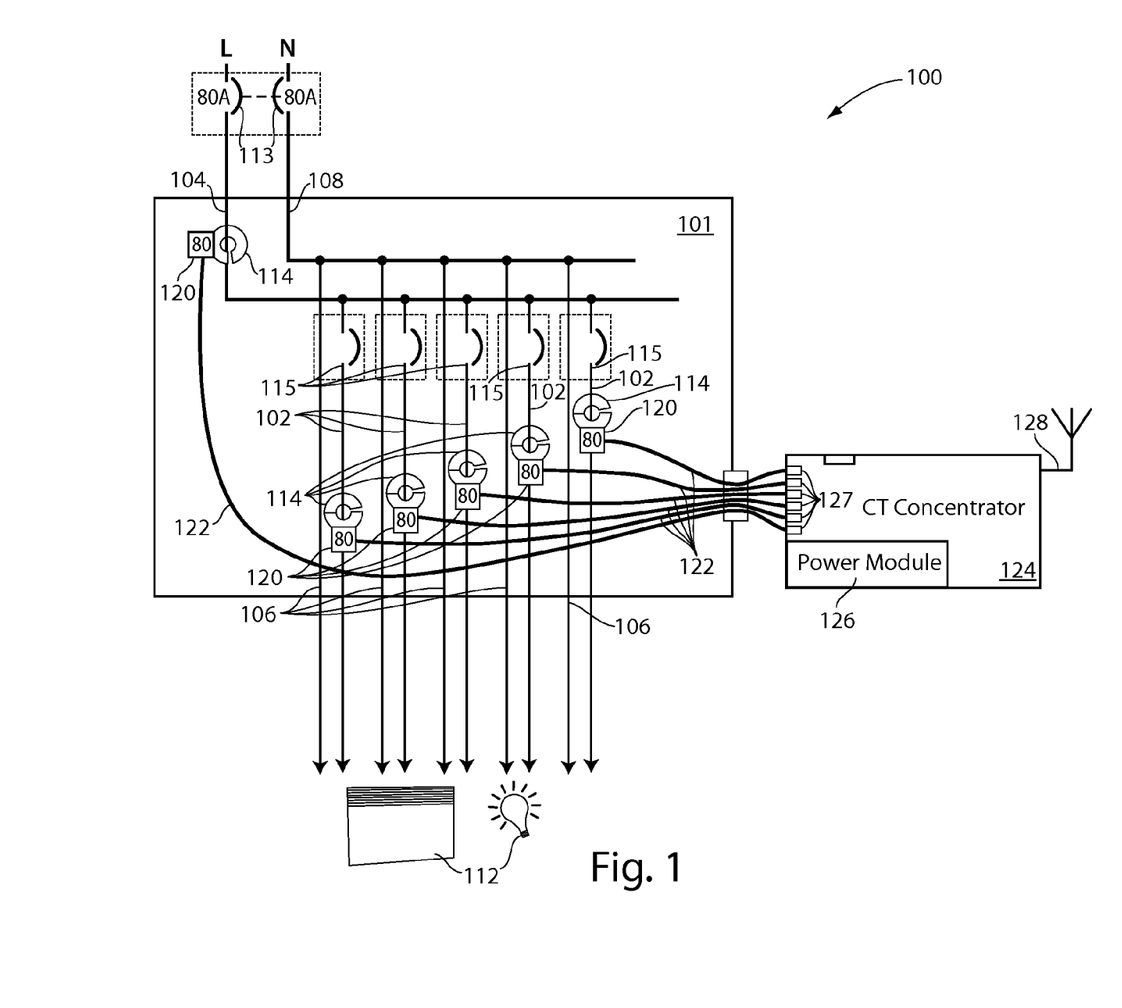
FIG. 1 is a circuit diagram of a load center in accordance with aspects of the present invention.

FIG. 1 is a circuit diagram of a load center 100 in accordance with aspects of one embodiment of the present invention. The load center 100 includes a housing 101. Within the housing 101, the load center 100 includes an input power line 104, a plurality of input power line circuit branches 102, a plurality of neutral line circuit branches 106, and a neutral line 108. The input power line 104 and the neutral line 108 are configured to be coupled to an external power source (e.g., a utility power system). Each one of the plurality of input power line circuit branches 102 is coupled between the input power line 104 and an external load 112 (e.g., an appliance, a power outlet, a light etc.). Each one of the plurality of neutral line circuit branches 106 is coupled between the neutral line 108 and an external load 112.

According to one embodiment, the input power line 104 includes a circuit breaker 113 coupled between the external power source and the input power line 104 and the neutral line 108 includes a circuit breaker 113 coupled between the external power source and the neutral line 108. According to another embodiment, each one of the plurality of circuit branches 102 includes a circuit breaker 115 coupled between the input power line 104 and an external load 112. In one embodiment, the current rating of each of the circuit breakers 113, 115 may be configured based on the power required by the external load 112 to which the circuit breakers 113, 115 associated circuit branch 102 is coupled.

Within the housing 101, the load center 100 also includes a plurality of Current Transformers (CT) 114 and a plurality of sensor circuits 120. Each one of the plurality of CT's 114 is coupled to at least one of the plurality of circuit branches 102. According to one embodiment, a CT 114 may also be coupled to the input power line 104. According to one embodiment, each CT 114 encompasses a corresponding circuit branch 102 or input power line 104. Each one of the plurality of CT's is also coupled to a corresponding sensor circuit 120. Each sensor circuit 120 is coupled to a terminal 127 of a CT concentrator 124 via a cable 122. According to one embodiment, the CT concentrator 124 is located external the housing 101; however, in other embodiments, the CT concentrator 124 is located within the housing 101.

The CT concentrator 124 includes a plurality of terminals 127, a power module 126 and wireless radio module and antenna 128. According to one embodiment, the plurality of terminals 127 are RJ-11 connectors; however, in other embodiments, any other appropriate connector may be utilized. According to one embodiment, the power module 126 is a battery pack configured to provide DC power to the CT concentrator 124; however, in other embodiments, the power module receives AC power from the input power line 104 (e.g. via at least one branch circuit 102), converts the AC power to DC power and provides the DC power to the CT concentrator 124.

AC power is provided from an external source (e.g., a utility power system) to the input power line 104. AC power from the input power line 104 is provided to each one of the external loads 112, via the loads associated circuit branch 102. The circuit breakers 113 are configured to automatically open and prevent current in the input power line 104 if an overload or short circuit is detected on the input power line 104. The circuit breakers 115 are configured to automatically open and prevent current in a circuit branch 102 if an overload or short circuit is detected in the circuit branch 102.

AC current passing through a circuit branch 102 or input power line 104 induces a proportionate AC measurement signal in its associated CT 114 which encompasses the circuit branch 102 or input line 104. According to one embodiment, where a CT 114 is coupled to multiple circuit branches 102, an AC measurement signal proportionate to the combined current in the multiple circuit branches is induced in the CT 114 which encompasses the multiple circuit branches.

The sensor circuit 120 coupled to the CT 114 transmits the proportionate AC measurement signals from the CT 114 to a terminal 127 of the CT concentrator 124 via its corresponding cable 122. The CT concentrator 124 receives the AC measurement signals from the sensor circuits 120. Upon receiving the current measurement signals from the sensor circuits 120, the CT concentrator 124 may display the current information to a user; analyze the received current information, use the current information in additional power calculations related to the associated circuit branches, transmit the information to an external client (e.g. a web server, in-home display, internet gateway, etc.) via the wireless radio module 128 or a hardwired connection, or any other appropriate action.

Figure 2:
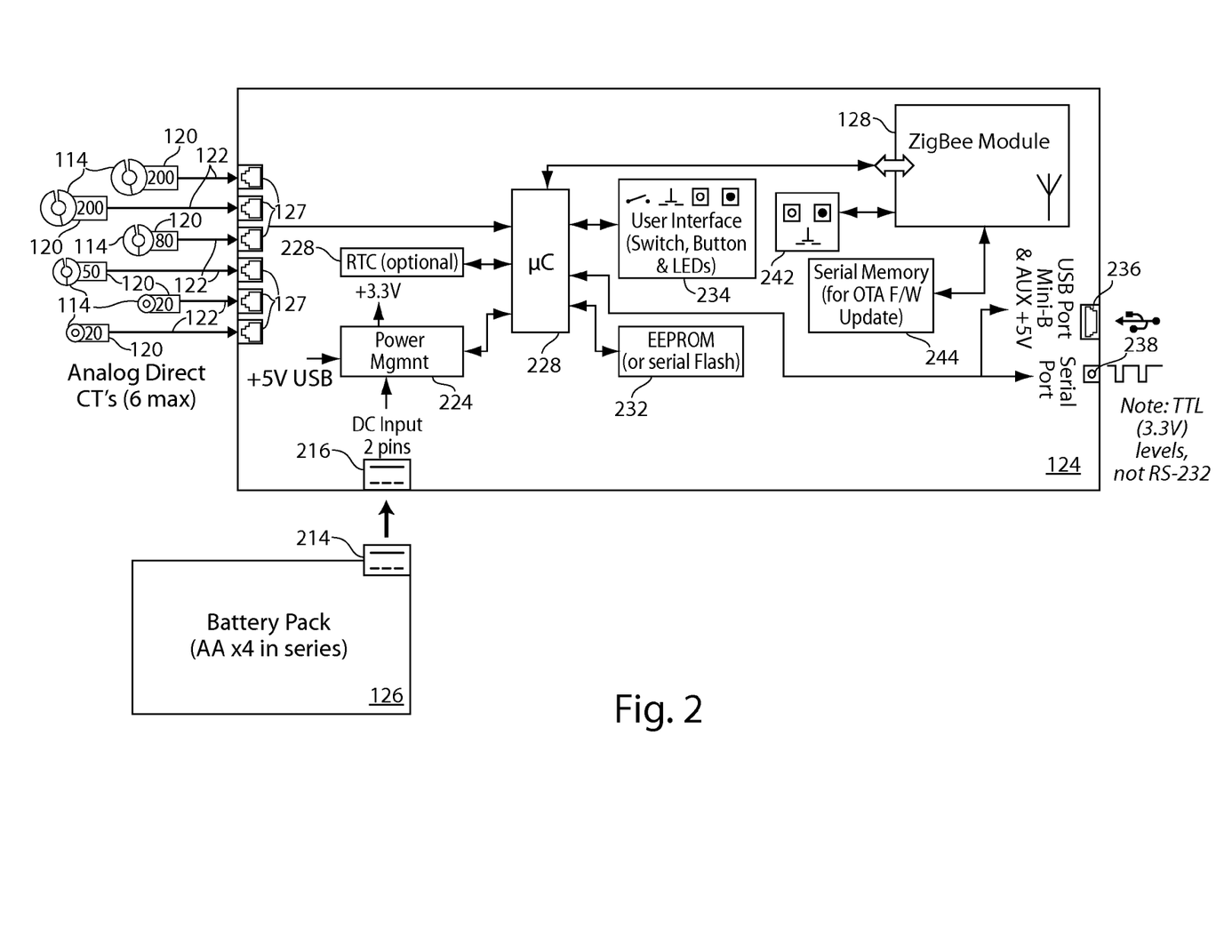
FIG. 2 is a block diagram of a concentrator in accordance with aspects of the present invention.

FIG. 2 is a block diagram of a CT concentrator 124 in accordance with aspects of the present invention. As discussed above, the CT concentrator 124 has a plurality of terminals 127 which are configured to be connected to a plurality of sensor circuits 120 and CT's 114 via cables 122. As also discussed above, the CT concentrator 124 includes a power module 126 and in one embodiment, the power module 126 is a battery pack. According to one embodiment, the battery pack includes 4 AA sized batteries connected in series and a DC interface 214. In one embodiment, the power module 126 is modular and may be removed from the CT concentrator 124.

According to one embodiment, the CT concentrator 124 includes a DC interface 216 configured to be coupled to the DC interface 214 of the battery pack 126. The DC interface 216 of the CT concentrator 124 is coupled to a power management module 224. The power management module 224 is coupled to a microcontroller 228. The microcontroller is coupled to the plurality of terminals 127. According to one embodiment, the microcontroller 228 includes an Analog to Digital Converter (ADC) which is configured to receive the analog current measurement signals from the terminals 127 (i.e. signals received at the terminals from the sensor circuits 120) and convert the analog signals to digital signals for further processing by the microcontroller 228. In one embodiment, the CT concentrator 124 also includes a Real Time Clock (RTC) 229 coupled to the microcontroller 228.

The CT concentrator 124 also includes a non-volatile memory module 232 coupled to the microcontroller 228. In one embodiment, the non-volatile memory module 232 includes Electrically Erasable Programmable Read-Only Memory (EEPROM); however, in other embodiments, the non-volatile memory module 232 may include any type of non-volatile memory (e.g., such as serial Flash memory).

The CT concentrator 124 also includes a user interface 234 coupled to the microcontroller 228. In some embodiments, the user interface may include any type of controls which allows a user to interface with the CT concentrator 124. (e.g., such controls include switches, buttons, LED's etc.). According to one embodiment, the CT concentrator 124 also includes a USB port 236 and a serial port 238.

The CT concentrator 124 also includes the wireless radio module and antenna 128 coupled to the microcontroller 228. In one embodiment, the wireless radio module 128 is a ZigBee radio; however, in other embodiments, the wireless radio module 128 may be configured using a different wireless standard. According to one embodiment, the wireless radio module and antenna 128 is also coupled to an On/Off switch 242 and a serial memory module 244.

The battery pack 127 provides DC power to the CT concentrator 124 via the DC interface 214 and the DC interface 216. The power management module 224 receives the DC power from the first DC interface 216 and provides appropriate DC power to components of the CT concentrator 124 (e.g., the microcontroller 228).

Upon being powered, the microcontroller 228 monitors signals at the terminals 127 and based on the signals at each terminal, the microcontroller 228 determines whether a CT 114 (and sensor circuit 120) is coupled to each terminal.

The microcontroller 228 compares the signals at each terminal to a pre-defined fixed signal envelope. According to one embodiment, the signal envelope is defined about a zero-crossing value at which analog measurement signals (received at the terminal 127 from a CT 114) would pass through under normal operating conditions (i.e. when a CT 114 is coupled to a terminal 127 and providing measurement signals to the terminal 127). For example, the fixed signal envelope defines a first fixed signal level that is greater than the zero-crossing value and a second fixed signal level that is less than the zero-crossing value.

According to one embodiment, the signal envelope is defined to be wide enough (i.e. the first and second fixed signal levels are far enough apart) that noise does not typically cause false tripping (i.e. the noise does not cause the signal to pass outside the signal envelope). According to another embodiment, the signal envelope is defined to be narrow enough (i.e. the first and second fixed signal levels are close enough) so that the connection of a sensor can be detected under a wide range of conditions and tolerances.

In one embodiment, the signals at the terminals 127 are compared to the signal envelope at a relatively fast rate (e.g. every 15 seconds). By comparing the signals to the signal envelope at a relatively fast rate, the microcontroller 228 is able to quickly determine, based on the signals at a terminal 127, whether the terminal 127 is connected to a CT 114.

If a signal at a terminal 127 passes outside of the signal envelope (i.e. is greater than the first fixed signal level or less than the second fixed signal level), the microcontroller 228 starts a countdown timer. If the signal received at the terminal passes back within the signal envelope (e.g. is less than the first fixed signal level and greater than the second fixed signal level), the microcontroller 228 resets the countdown timer. If the countdown timer expires prior to being reset, the microcontroller 228 determines, because the received signal has been outside of the signal envelope longer than would be expected for an analog measurement signal received from a CT 114 connected to the terminal 127, that the terminal is not connected to a CT 114. According to one embodiment, the value of the timer is defined so that a worst case signal frequency and amplitude is accounted for without false tripping.

Figure 3:
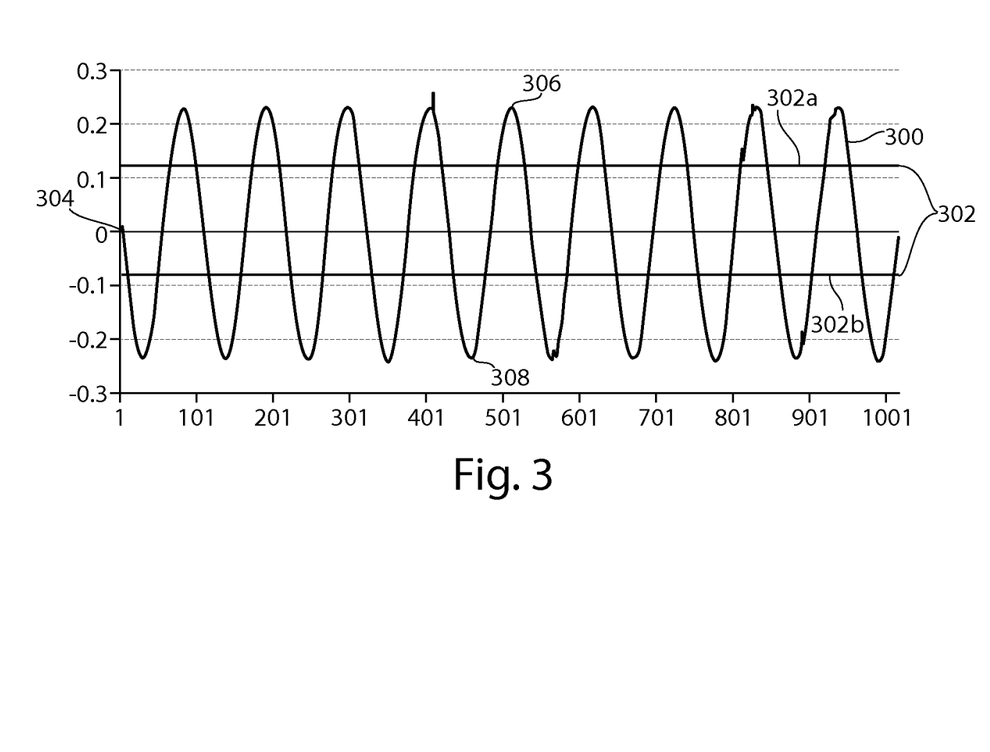
FIG. 3 is a graph illustrating a signal at a terminal of a concentrator corresponding to a current sensor that is connected to the terminal and to a circuit branch which is providing power to a load in accordance with aspects of the present invention.

For example, FIG. 3 is a graph illustrating a measurement signal 300 output by a CT 114 (and received by the microcontroller 228 via a terminal 127) that is connected to a terminal 127 and to an associated circuit branch 102 that is providing power to a load 112. The measurement signal 300 is proportionate to current in the associated circuit branch 102. The graph of FIG. 3 also illustrates a fixed signal envelope 302 about the zero-crossing value 304 at which the received analog measurement signal 300 would pass through under normal operating conditions (i.e. when a CT 114 is coupled to a terminal 127). The fixed signal envelope includes a first fixed signal level 302a greater than the zero-crossing value and a second fixed signal level 302b less than the zero-crossing value.

The measurement signal 300 is substantially within the signal envelope 302 and only portions of the measurement signal 300 near the peaks 306 and troughs 308 extend outside of the signal envelope 302 (i.e. are greater than the first fixed signal level 302a or less than the second fixed signal level 302b). However, as the measurement signal 300 passes back to within the signal envelope 302 (e.g. is less than the first fixed signal level 302a and greater than the second fixed signal level 302b), the microcontroller's 228 countdown timer (which was started once the signal 300 extended outside of the signal envelope 302) is reset and not allowed to expire. Therefore, upon receiving such a signal 300 as illustrated in FIG. 3 at a terminal 127, the microcontroller 228 identifies that the terminal 127 corresponding to the received signal 300 is coupled to a CT 114.

Figure 4:
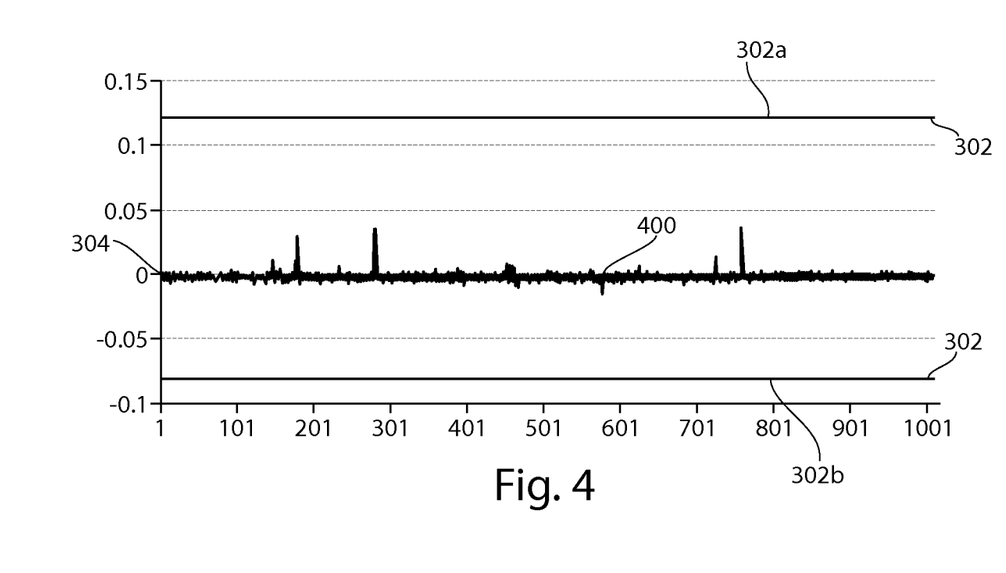
FIG. 4 is a graph illustrating a signal at a terminal of a concentrator corresponding to a current sensor that is connected to the terminal and to a circuit branch which is not providing power to a load in accordance with aspects of the present invention.

FIG. 4 is a graph illustrating a measurement signal 400 output by a CT 114 (and received by the microcontroller 228 via a terminal 127) that is connected to a terminal 127 and to an associated circuit branch 102 that is not providing power to a load 112. The graph of FIG. 4 also illustrates the fixed signal envelope 302 (having the first fixed signal level 302a and the second fixed signal level 302b) about the zero-crossing value 304 at which the received analog measurement signal 400 would pass through under normal operating conditions (i.e. when a CT 114 is coupled to a terminal 127). The measurement signal 400, which is proportionate to current in the associated circuit branch 102, is substantially zero as the associated circuit branch 102 is not currently powering a load. However, the measurement signal 400 falls entirely within the signal envelope 302 (i.e. is less than the first fixed signal level 302a and greater than the second fixed signal level 302b). The microcontroller's 228 countdown timer is not started and hence, does not expire. Therefore, upon receiving such a signal 400 as illustrated in FIG. 4 at a terminal 127, the microcontroller 228 identifies that the terminal 127 corresponding to the received signal 400 is coupled to a CT 114.

Figure 5:
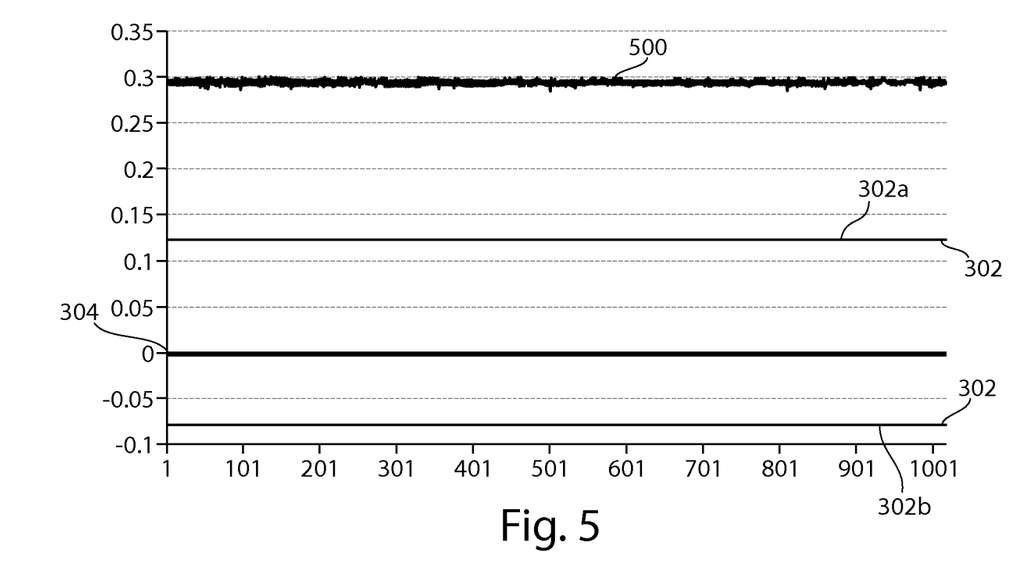
FIG. 5 is a graph illustrating a signal at a terminal of a concentrator corresponding to the terminal being disconnected from a current sensor in accordance with aspects of the present invention.

FIG. 5 is a graph illustrating a signal 500 at a terminal 127 that indicates to the microcontroller 228 that the terminal 127 is not connected to a CT 114. The graph of FIG. 5 also illustrates the fixed signal envelope 302 (having the first fixed signal level 302a and the second fixed signal level 302b) about the zero-crossing value 304 at which a received analog measurement signal 500 would pass through under normal operating conditions (i.e. when a CT 114 is coupled to a terminal 127). The signal 500 has an abnormal significant DC offset (which is not present when a terminal 127 is receiving appropriate measurement signals from a CT 114) and is entirely outside of the signal envelope 302 (i.e. entirely greater than the first fixed signal level 302a).

For example, according to one embodiment, a resistor in the CT 114 typically connects the ADC input of the microcontroller 228 to a DC bias voltage in the middle of the ADC's voltage range (the level of the DC bias is interpreted by the microcontroller as the zero-crossing value 304). Current waveforms induced in the CT 114, proportionate to the current in the associated circuit branch 102, produce a proportionate voltage across this resistor, causing the voltage signal (e.g. signal 300) seen by the microcontroller's 228 ADC to vary around this DC bias level. When a CT 114 is not connected to a terminal 127, the input to the ADC is no longer connected to the zero-crossing level DC bias. Leakage current through clamping diodes connected to the ADC input cause the otherwise unloaded signal to be pulled towards the rail voltage, producing the very high signal 500 outside of the envelope 302.

In another embodiment, there are no connections to the ADC when a CT 114 is disconnected from a terminal 127, and the voltage signal seen by the microcontroller measures no voltage, producing a current signal which is very low and less then the second fixed signal level 302b and outside of the envelope 302.

Upon receiving a signal outside of the envelope 302 (e.g. high signal 500), the countdown timer of the microcontroller 228 starts and as the signal 500 does not pass back within the signal envelope 302 (i.e. less than the first fixed signal level 302a), the timer expires. Upon expiration of the timer, the microcontroller 228 identifies that the terminal 127 associated with the signal 500 is not actually connected to a CT 114.

By monitoring the actual signals at the terminals 127, which normally receive measurement signals from CT's 114, the microcontroller 228 is able to identify which terminals 127 are actually coupled to CT's 114, absent the need for a separate subsystem.

Upon determining that a terminal 127 is not connected to a CT 114, the microcontroller 228 may take additional appropriate action with regards to the terminal 127. For example, in one embodiment, the microcontroller 228 activates a standard separate CT detection subsystem (as described above) to confirm that the terminal 127 is disconnected from a CT 114. In another embodiment, in an effort to save power, the microcontroller 228 stops monitoring the signals received from the CT 114 at the terminal 127 until a standard CT detection subsystem identifies that a new CT 114 has been connected to the terminal 127.

Figure 6:
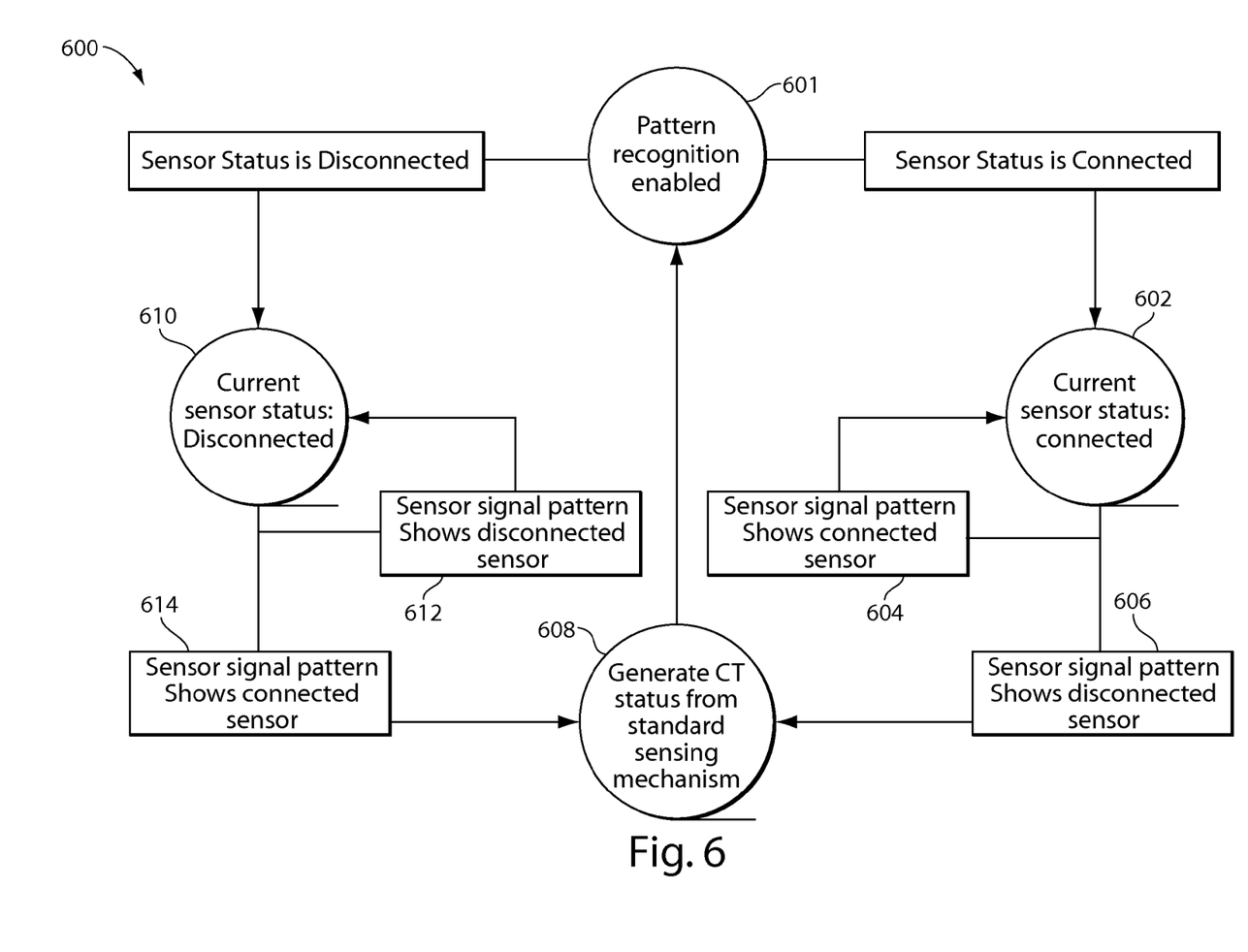
FIG. 6 is a state diagram of a method for detecting the presence of a current sensor in accordance with aspects of the present invention.

FIG. 6 is a state diagram 600 of a method for detecting the presence of a current sensor (e.g. a CT 114) in accordance with aspects of the present invention.

At state 601, the microcontroller 228 is powered and monitors signals at a terminal 127 to determine whether the terminal 127 is connected to a CT 114.

At state 602, where the microcontroller 228 has previously identified the terminal 127 as being connected to a CT 114, a determination is made, based on the analysis of signals received from the terminal 127 (as described above)

whether the terminal 127 is still connected to a CT 114. In response to a determination 604 that the terminal 127 is still connected to a CT 114 (e.g. because the signals received at the terminal 127 are within the fixed signal envelope), the microcontroller 228 remains in state 602. In response to a determination 606 that the terminal 127 is disconnected from a CT 114 (e.g. because the signals received at the terminal 127 are outside of the fixed signal envelope for longer than a predetermined amount of time), the microcontroller 228 transitions to state 608.

At state 610, where the microcontroller 228 has previously identified the terminal 127 as being disconnected from a CT 114, a determination is made, based on the analysis of signals received from the terminal 127 (as described above) whether the terminal 127 is still disconnected from a CT 114. In response to a determination 612 that the terminal 127 is still disconnected from a CT 114 (e.g. because the signals received at the terminal 127 are outside of the fixed signal envelope for longer than a predetermined amount of time), the microcontroller 228 remains in state 610. In response to a determination 614 that the terminal 127 is connected to a CT 114 (e.g. because the signals received at the terminal 127 are within the fixed signal envelope), the microcontroller 228 transitions to state 608.

According to one embodiment, at state 608, the microcontroller 228 activates a standard sensing mechanism (e.g. a standard CT detection subsystem as described above) to confirm the connection status of the terminal 127.

As described herein, the microcontroller monitors terminals 127 to determine whether the terminals are connected to CT's; however, in other embodiments, the microcontroller may monitor the terminals 127 to determine whether the terminals are connected to any other type of current sensor.

As described herein, a terminal 127 disconnected from a CT 114 results in a high DC offset signal being provided to the microcontroller 228; however, in other embodiments, any other type of signal, outside of the fixed signal envelope for a predetermined amount of time, may signify to the microcontroller 228 that the terminal 127 is disconnected from the CT 114.

By frequently monitoring the signals at the terminals 127, which are normally utilized to receive measurement signals from the CT's 114, the microcontroller 228 is able to quickly identify which terminals 127 are actually coupled to CT's 114, absent a separate subsystem (e.g., including a voltage divider as described above) which may waste power.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system monitor for a load center comprising:
a current sensor configured to be coupled to a circuit branch within the load center and to produce a measurement signal having a level related to a current level of the circuit branch;
a sensor circuit coupled to the current sensor and removably coupled to a terminal, the sensor circuit configured to provide the measurement signal to the terminal; and
a controller coupled to the terminal and configured to monitor signals at the terminal, wherein the controller is further configured to detect disconnection of the current sensor from the terminal based on the level of the measurement signal at the terminal falling outside of a predetermined envelope for a predetermined period of time,
wherein the controller includes a timer having a value equal to the predetermined period of time, and wherein the controller is further configured to start the timer in response to detection of the signal level at the terminal falling outside of the predetermined envelope and determine that the current sensor is disconnected from the terminal in response to expiration of the timer.

2. The system of claim 1, wherein the controller is further configured to detect connection of the current sensor to the terminal based on the measurement signal at the terminal falling within the predetermined envelope.

3. The system of claim 1, wherein the controller is further configured to reset the timer in response to the measurement signal at the terminal falling within the predetermined envelope after previously falling outside of the predetermined envelope.

4. The system of claim 1, wherein the current sensor includes a current transformer.

5. The system of claim 1, wherein the controller is further configured to monitor signals at the terminal at 15 second intervals.

6. The system of claim 1, wherein the predetermined envelope is defined about a zero-crossing value.

7. A method for monitoring current in a load center using a current sensor coupled to a circuit branch within the load center, the method comprising:
monitoring a signal at the terminal;
comparing a signal level of the signal at the terminal with a predetermined envelope, the predetermined envelope defined based on an expected value of the signal when the current sensor is connected to the terminal;
determining that the signal level at the terminal falls outside of the predetermined envelope;
starting a timer in response to determining that the signal level at the terminal falls outside of the predetermined envelope, the timer having a value equal to a predetermined period of time; and
identifying that the current sensor is disconnected from the terminal in response to expiration of the timer indicating that the level of the measurement signal has fallen outside of the predetermined envelope for the predetermined period of time.

8. The method of claim 7, further comprising resetting the timer in response to determining that the signal level at the terminal falls within the predetermined envelope after previously falling outside of the predetermined envelope.

9. The method of claim 7, further comprising identifying that the current sensor is connected to the terminal in response to the signal level at the terminal falling within the predetermined envelope.

10. The method of claim 7, further comprising discontinuing monitoring signals at the terminal in response to identifying that the current sensor is disconnected from the terminal.

11. The method of claim 7, wherein comparing the signal level at the terminal with a predetermined envelope is performed at 15 second intervals.

12. The method of claim 7, wherein the current sensor includes a current transformer.

13. The method of claim 7, further comprising defining the predetermined envelope around a zero-crossing.

* * * * *